United States Patent
Wattelet et al.

(10) Patent No.: US 6,830,097 B2
(45) Date of Patent: Dec. 14, 2004

(54) COMBINATION TOWER AND SERPENTINE FIN HEAT SINK DEVICE

(75) Inventors: Jonathan P. Wattelet, Gurnee, IL (US); Scott D. Garner, Lititz, PA (US)

(73) Assignee: Modine Manufacturing Company, Racine, WI (US)

(*) Notice: Subject to any disclaimer, the term of this patent is extended or adjusted under 35 U.S.C. 154(b) by 0 days.

(21) Appl. No.: 10/259,311

(22) Filed: Sep. 27, 2002

(65) Prior Publication Data

US 2004/0060690 A1 Apr. 1, 2004

(51) Int. Cl.⁷ .................. F28D 15/02; H01L 23/427; H01L 23/467
(52) U.S. Cl. ................. 165/104.21; 165/80.3; 165/185; 165/104.33; 361/697; 257/722
(58) Field of Search ................. 165/80.3, 185, 165/121, 122, 104.21, 104.26, 104.33; 361/700, 697; 257/714, 715, 722; 174/15.3, 16.3

(56) References Cited

U.S. PATENT DOCUMENTS

| | | |
|---|---|---|
| 2,680,009 A | 6/1954 | Nekut |
| 2,745,895 A | 5/1956 | Lideen |
| 2,917,286 A | 12/1959 | Deakin |
| 3,023,264 A | 2/1962 | Allison |
| 3,180,404 A | 4/1965 | Nelson et al. |
| 3,185,756 A | 5/1965 | Allison |
| 3,187,812 A | 6/1965 | Staver |
| 3,260,787 A | 7/1966 | Finch |
| 3,542,124 A | 11/1970 | Manfredo |
| 4,605,058 A | 8/1986 | Wilens |
| 4,753,290 A | 6/1988 | Gabuzda |
| 4,884,631 A | 12/1989 | Rippel |
| 4,941,530 A | 7/1990 | Crowe |
| 4,944,344 A | 7/1990 | Crowe |
| 5,107,922 A | 4/1992 | So |
| 5,195,576 A | 3/1993 | Hatada et al. |
| 5,251,101 A | 10/1993 | Liu |
| 5,299,632 A | 4/1994 | Lee |
| 5,375,655 A | 12/1994 | Lee |
| 5,421,402 A | 6/1995 | Lin |
| 5,490,558 A | 2/1996 | Akachi |
| 5,494,098 A | 2/1996 | Morosas |
| 5,518,071 A | 5/1996 | Lee |

(List continued on next page.)

FOREIGN PATENT DOCUMENTS

| | | | |
|---|---|---|---|
| EP | 1 081 760 A2 | 3/2002 | |
| JP | 403108747 | * 5/1991 | ............ 165/104.33 |

*Primary Examiner*—Ramesh Krishnamurthy
(74) *Attorney, Agent, or Firm*—Wood, Phillips, Katz, Clark & Mortimer

(57) ABSTRACT

A heat sink (10) is provided for use with a fan (16) for cooling an electronic component (12) wherein the heat sink (10) transfers heat from a heat rejecting surface (14) of the electronic component (12) to a cooling airflow provided by the fan (16). The heat sink (10) includes a heat conducting base member (20) having a substantially planar heat receiving surface (22) for overlaying the heat rejecting surface (14) of the electronic component (12) to receive heat therefrom, a heat conducting tower (24) extending from a side of the base member (20) opposite from the heat receiving surface (22) to receive heat therefrom, and a pair of serpentine fins (30) to transfer heat from the tower (24) to the airflow and the environment surrounding the heat sink (10).

24 Claims, 3 Drawing Sheets

U.S. PATENT DOCUMENTS

| | | |
|---|---|---|
| 5,597,034 A | 1/1997 | Barker, III et al. |
| 5,653,285 A | 8/1997 | Lee |
| 5,727,622 A | 3/1998 | Gurevich et al. |
| 5,791,406 A | 8/1998 | Gönner et al. |
| 5,794,685 A | 8/1998 | Dean |
| 5,892,655 A | 4/1999 | Grouell |
| 5,894,882 A | 4/1999 | Kikuchi et al. |
| 5,975,194 A | 11/1999 | Wagner |
| 6,009,937 A | 1/2000 | Gönner et al. |
| 6,015,008 A | 1/2000 | Kogure et al. |
| 6,018,459 A | 1/2000 | Carlson et al. |
| 6,109,341 A | 8/2000 | Kodaira et al. |
| 6,135,200 A | 10/2000 | Okochi et al. |
| 6,157,539 A | 12/2000 | Wagner et al. |
| 6,196,300 B1 | 3/2001 | Checchetti |
| 6,199,624 B1 | 3/2001 | Wotring |
| 6,223,813 B1 | 5/2001 | Chrysler et al. |
| 6,311,766 B1 | 11/2001 | Lin et al. |
| 6,315,033 B1 | 11/2001 | Li |
| 6,324,061 B1 | 11/2001 | Kinoshita et al. |
| 6,327,145 B1 | 12/2001 | Lian et al. |
| 6,330,908 B1 | 12/2001 | Lee et al. |
| 6,336,497 B1 | 1/2002 | Lin |
| 6,336,499 B1 | 1/2002 | Liu |
| 6,360,816 B1 | 3/2002 | Wagner |
| 6,367,542 B1 | 4/2002 | Chen |
| 6,371,200 B1 | 4/2002 | Eaton |
| 6,386,274 B1 | 5/2002 | Wang et al. |
| 6,386,275 B1 | 5/2002 | Kuo et al. |
| 6,404,637 B2 | 6/2002 | Hutchison et al. |

* cited by examiner

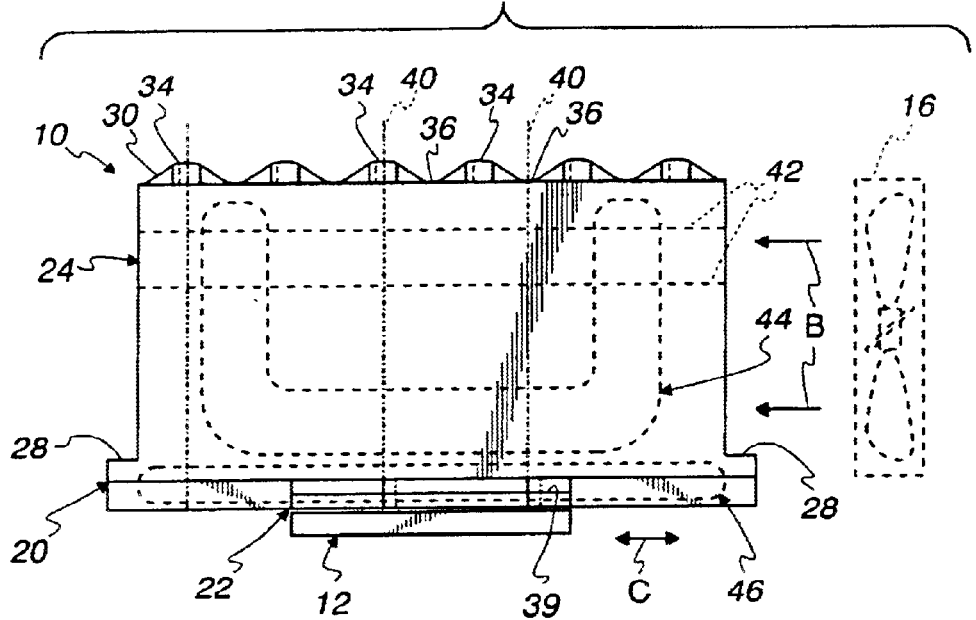
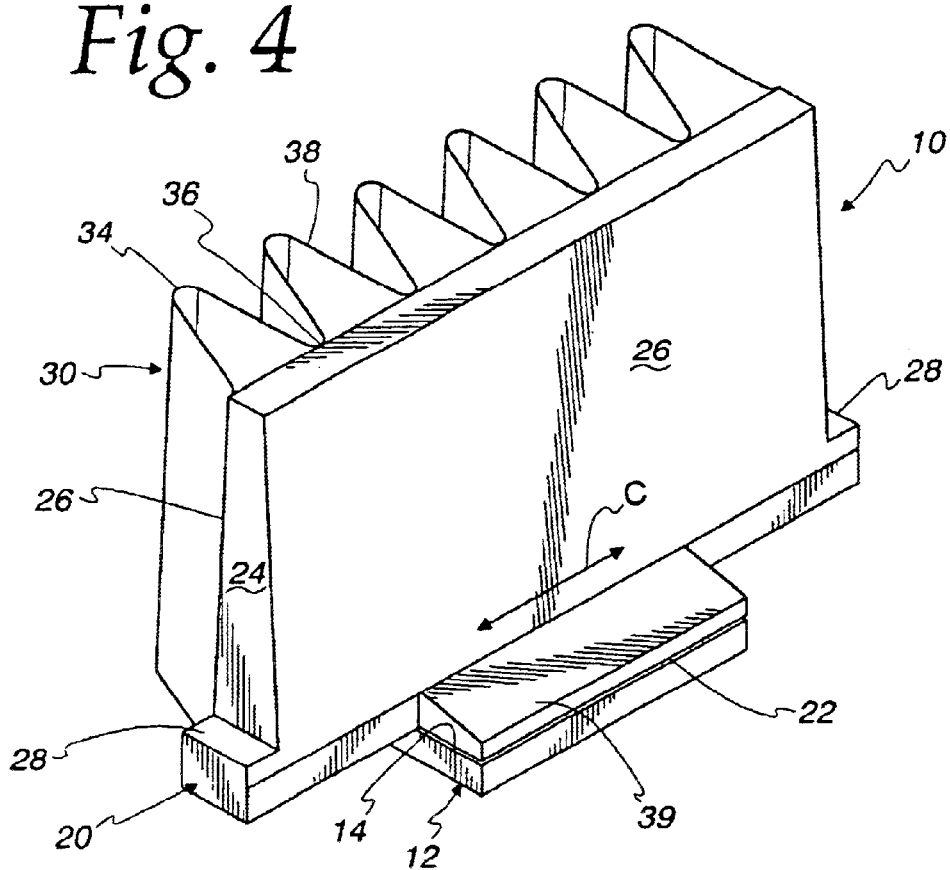

COMBINATION TOWER AND SERPENTINE FIN HEAT SINK DEVICE

FIELD OF THE INVENTION

This device relates to heat sinks, and more particularly to heat sink devices that utilize a cooling airflow from a fan for cooling an electronic component such as an integrated circuit chip, a CPU chip, a large scale chip package, or a very large scale chip package.

BACKGROUND OF THE INVENTION

Heat sink devices are known that include a base having one surface adapted for receiving heat from an electronic component and another surface for mounting a heat conductive, serpentine fin for transferring heat from the heat sink device to an airflow provided by a fan that either directs the airflow perpendicular to the heat rejecting surface of the electronic component or parallel to the heat rejecting surface of the electronic component. While at least some of these devices may work well for their intended purpose, there is always room for improvement. For example, in the field of computing, there is an ever increasing requirement for heat rejection from the CPU chip as the power and speed of the CPU chip increase. In this regard, the capabilities of current heat sink devices will be outstripped by the next generation of CPU chips.

SUMMARY OF THE INVENTION

It is the principal object of the invention to provide a new and improved heat sink.

It is another object of the invention to provide a new and improved heat sink for use with an impingement airflow fan.

In one form of the invention, a heat sink is provided for use with a fan for cooling an electronic component wherein the heat sink transfers heat from a heat rejecting surface of the electronic component to a cooling airflow provided by the fan. The heat sink includes a heat conducting base member including a substantially planar heat receiving surface for overlaying the heat rejecting surface of the electronic component to receive heat therefrom, a heat conducting tower extending from a side of the base member opposite from the heat receiving surface to receive heat therefrom, and a pair of serpentine fins to transfer heat from the tower to the airflow and the environment surrounding the heat sink. The tower includes a pair of spaced, oppositedly facing fin mount surfaces, with the spacing between the fin mount surfaces defining a width of the tower. The fin mount surfaces are planar, with the plane of each surface lying within 25° of perpendicular to the heat receiving surface. Each of the fin mounts surfaces has an area larger than the area of the heat receiving surface. Each of the serpentine fins is formed from a folded strip of heat conducting material including a plurality of peaks and valleys connected by sidewalls. The valleys of one of the serpentine fins are bonded to one of the fin mount surfaces, and the valleys of the other serpentine fin are bonded to the other fin mount surface.

In one form, the peaks and valleys lie in planes that are substantially perpendicular to the heat receiving surface.

In another form, the peaks and valleys extend substantially parallel to the heat receiving surface.

In one form, the base and tower are a unitary piece of copper material.

In one form, the tower includes at least one heat pipe. In one embodiment of this form, the at least one heat pipe includes sidewalls that form at least part of each of the fin mount surfaces. In an alternate form, the heat pipe is embedded in at least one of the tower and the base.

In one form, the heat pipe is provided in the form of a vapor chamber enclosed within the base and the tower and a two phase fluid sealed within the vapor chamber, with the base acting as an evaporator of the heat pipe and the tower acting as a condenser of the heat pipe.

In one form, the fin mount surfaces extend past the heat receiving surface in a direction parallel to the heat receiving surface.

In one form, the heat receiving surface is larger than the width of the tower in a direction parallel to the width of the tower.

In accordance with one aspect of the invention, a heat sink is provided for use with an impingement type fan for cooling an electronic component wherein the heat sink transfers heat from a heat rejecting surface of an electronic component to an impingement airflow provided by the fan in a direction perpendicular to the heat rejecting surface. The heat sink includes a heat conducting base member having a substantially planar heat receiving surface for overlaying the heat rejecting surface of the electronic component to receive heat therefrom, a heat conducting tower extending from a side of the base member opposite from the heat receiving surface to receive heat therefrom, and a pair of serpentine fins to transfer heat from the tower to the airflow. The tower includes a pair of spaced, oppositedly facing fin mount surfaces, with the spacing between the fin mount surfaces defining a width of the tower. The fin mount surfaces are planar, with the plane of each surface lying within 25° of perpendicular to the heat receiving surface. Each serpentine fin is formed from a folded strip of heat conducting material including a plurality of peaks and valleys connected by sidewalls. The peaks and valleys lie in planes that are substantially perpendicular to the heat rejecting surface. The valleys of one of the serpentine fins is bonded to one of the fin mount surfaces, and the valleys of the other serpentine fin are bonded to the other fin mount surface.

Other objects and advantages will become apparent from the following specification, including the drawings and independent claims.

DESCRIPTION OF THE DRAWINGS

FIG. 3 is a view taken from line 3—3 in FIGS. 1 and 2, again with on of the serpentine fins removed;

FIG. 4 is a perspective view of the heat sink of FIGS. 1–3, again showing the tower with one serpentine fin removed;

DETAILED DESCRIPTION OF THE PREFERRED EMBODIMENTS

Figure 1:
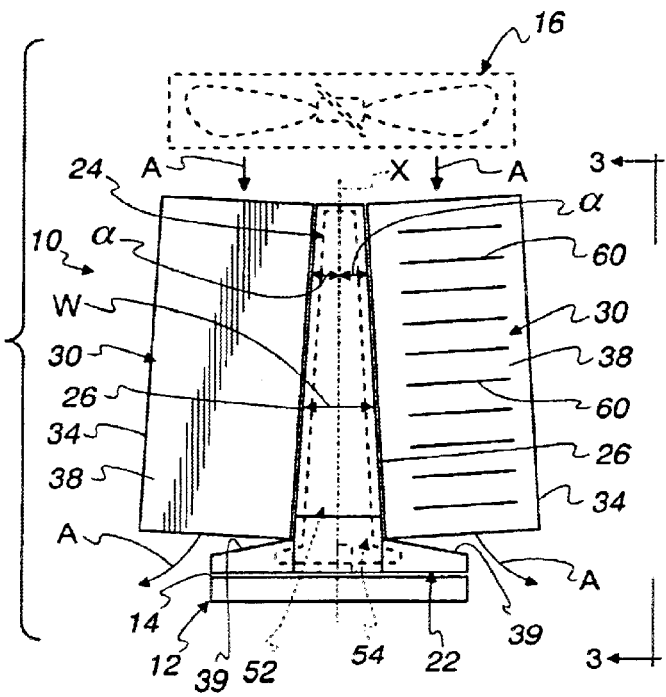
FIG. 1 is a elevation view of a heat sink including a tower and serpentine fin combination embodying the present invention.

As seen in FIGS. 1–4, a heat sink 10 is provided for cooling an electronic component 12, such as for example an integrated circuit, a CPU chip, a large scale chip package, or a very large scale chip package, having a surface 14 that rejects heat. The heat sink device transfers heat from the surface 14 of the electronic component 12 to a cooling airflow A provided by a fan 16, which in the illustrated embodiment is mounted above the heat sink device 10 to direct an impingement airflow substantially perpendicular to the surface 14.

The heat sink device 10 includes a base 20 including a substantially planar heat receiving surface 22 that overlays the heat rejecting surface 14 to receive heat therefrom. As shown in FIGS. 1–4, the heat receiving surface 22 is preferably substantially the same size/area as the heat rejecting surface 14 of the electronic component 12. It should be understood that for purposes of illustration the surfaces 14 and 22 are shown slightly spaced from each other, but in practice the surfaces will be abutted against each other or have a thermal transmitter, such a thermal gel, sandwiched between them.

Figure 2:
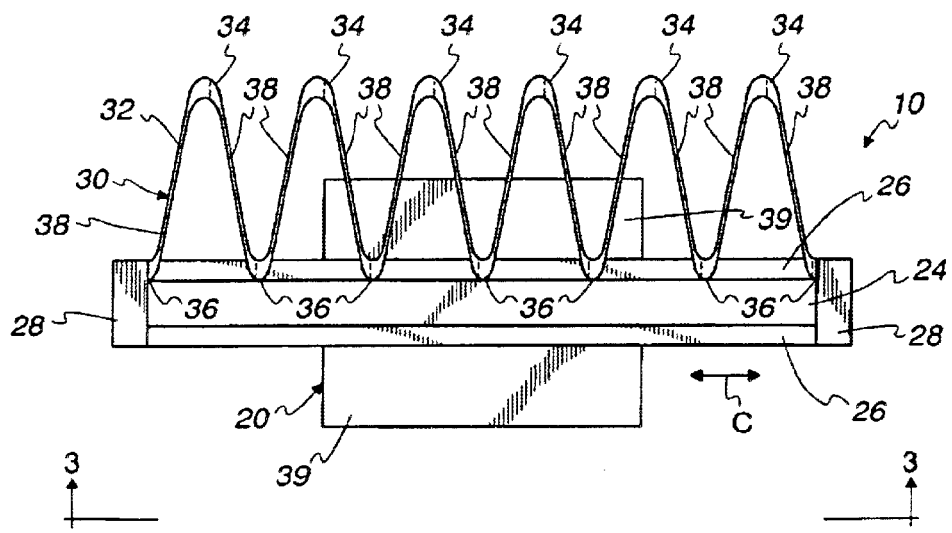
FIG. 2 is a top view of the heat sink of FIG. 1 with one of the serpentine fins removed from the tower.

The heat sink 10 further includes a heat conducting tower 24 extending from a side of the base member 20 opposite from the heat receiving surface 22 to receive heat therefrom. The tower includes a pair of spaced, oppositely facing fin mount surfaces 26, with the spacing between the fin mount surfaces 26 defining a width W of the tower 24. As best seen in FIGS. 1 and 4, each of the fin mount surfaces 26 is planar, with the plane of each surface lying within 25° of perpendicular to the heat receiving surface 22. Preferably, again as shown in FIGS. 1–4, each of the fin mount surfaces 26 has an area larger than the area of the heat receiving surface 22. Further, again as seen in FIGS. 2–4, it is also preferable that the fin mount surfaces 26 extend past the heat receiving surface 22 in a direction, shown by arrow C, parallel to the heat receiving surface 22 and the fin mount surfaces 26. Additionally, again as seen in FIGS. 1 and 2, it is also preferable that the heat receiving surface 22 be larger than the width W of the tower 24 in a direction parallel to the width W of the tower 24. Finally, in the illustrated embodiment, the base 20 includes a pair of spaced shoulders 28 extending outward from the tower 24 for engagement with a suitable mount structure (not shown) for connecting the heat sink 10 to additional system components, such as for example, the fan 16 or a circuit board on which the electronic component 12 is mounted.

The heat sink 10 further includes a pair of serpentine fins 30 (one of the fins 30 is removed in FIGS. 2–4 for purposes of illustration) to transfer heat from the tower 24 to the airflow from the fan 16. Each serpentine fin 30 is formed from a folded strip of heat conducting material 32 including a plurality of peaks 34 and valleys 36 connected by sidewalls 38, as best seen in FIGS. 2 and 4. In this regard, any suitable heat conductive sheet material, such as for example aluminum or copper, can be used for the material 32. The valleys 36 of one of the serpentine fins 30 are bonded to one of the fin mount surfaces 26, and the valleys 36 of the other serpentine fin 30 are bonded to the other fin mount surface 26. In this regard, any suitable bonding technique, such as brazing, soldering, or epoxy, may be used as dictated by the particular requirements of each heat sink device, such as, for example, the material selected for the tower 24 and the serpentine fins 30. As best seen in FIGS. 1 and 4, the base 20 preferably includes downwardly angled surfaces 39 that underlie the fins 30 opposite the heat receiving surface 22 so as to allow the airflow to escape from the fins 30 past the base 20.

As seen in FIGS. 3–4, in the illustrated embodiment, the peaks 34 and the valleys 36 lie in planes, shown schematically by dash lines 40, that are substantially perpendicular to the heat receiving surface 22 so as to be parallel to the impingement airflow A. However, in some embodiments it may be advantageous for the serpentine fins 30 to be bonded to the fin mount surfaces 26 so that the peaks 34 and valleys 36 extend at other angles. For example, in some embodiments, the peaks and valleys may extend substantially parallel to the heat receiving surface, as shown by the phantom lines 42 in FIG. 3, so as to receive an airflow B from a fan 16 (shown in phantom in FIG. 3) that directs the airflow B substantially parallel to the heat rejecting surface 14 and the heat receiving surface 22.

In some embodiments, the base 20 and the tower 24 are a unitary piece of suitable heat conducting material, such as copper or aluminum. In one highly preferred embodiment, the base and tower are a unitary piece of CDA 101 copper. Further, some embodiments may include one or more heat pipes that * are embedded in the tower 24 and/or the base 20. One possible example is shown diagrammatically in FIG. 3 wherein a U-shaped heat pipe, shown by phantom line 44 is provided in the tower 24 and a straight heat pipe, shown by phantom line 46, is embedded in the base 20.

Figure 5:
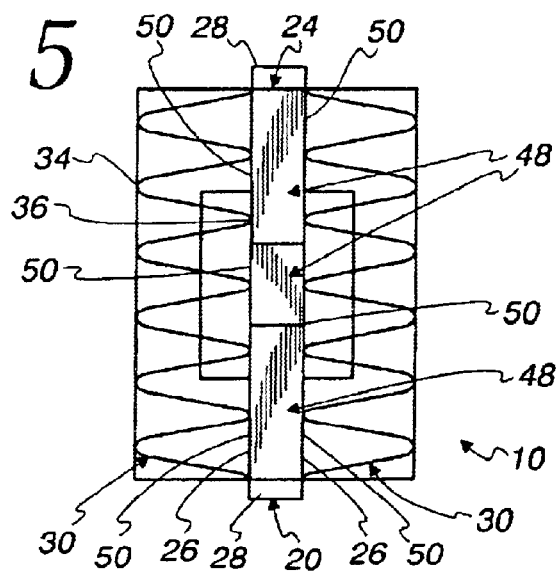
FIGS. 5–7 are somewhat diagrammatic top views of alternate embodiments of heat sinks embodying the present invention.

As another alternate embodiment, best seen in FIG. 5, the tower 24 can be formed from one or more heat pipes 48 (3 shown in FIG. 5) that extends upward from the base 20, with each of the heat pipes 48 including sidewalls 50 that form at least part of each of the fin mount surfaces 26.

As another alternate embodiment of the heat sink 10, the heat sink 10 may include a heat pipe 52 (shown diagrammatically by dashed lines in FIG. 1) defined by a vapor chamber 54 enclosed within the base 20 and the tower 24 and having a suitable two-phase fluid, such as water, sealed with the chamber 54, with the base 20 acting as an evaporator of the heat pipe 52 and the tower 24 acting as a condenser of the heat pipe 52. In this regard, both the base 20 and the tower 24 are hollow so as to define the vapor chamber 54 within the base 20 and the tower 24.

Figure 6:
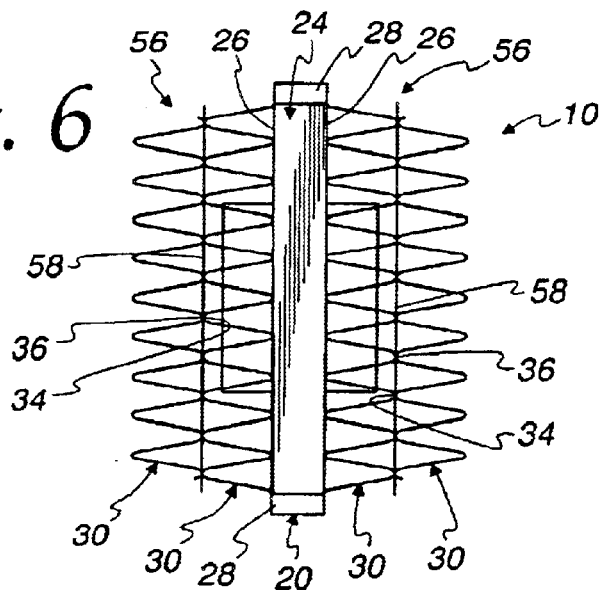

As best seen in FIG. 6, in yet another embodiment of the heat sink 10, stacks 56 of serpentine fins 30 can be mounted on the fin mount surfaces 26, with the serpentine fins 30 in each stack 56 having their respects peaks 34 and valleys 36 bonded to planar separator plates 58 sandwiched between the adjacent fins 30 of the stack 56. This construction offers a possible advantage because the fin density the number can be increased with a decrease in the fin height of each serpentine fin 30.

Figure 7:
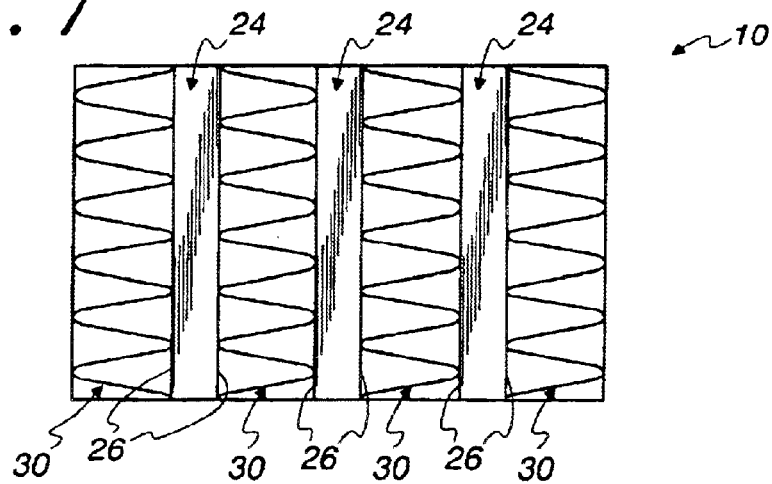

Yet another alternate embodiment of the heat sink 10 is shown in FIG. 7, wherein the heat sink 10 includes multiple towers 24 and multiple fins 30 sandwiched between the towers 24.

The serpentine fins 30 may be plain fins as shown by the fin 30 on the left side of FIG. 1, or may include any suitable surface enhancement on the sidewalls 38, such as for example, louvers, slits, or embossments, all of which are intended to be shown schematically by the lines 60 on the right side fin 30 in FIG. 1. In this regard, it should be appreciated that the particular details of the serpentine fins 30, such as the fin height, fin pitch, fin material, and surface enhancement, will be highly be dependent upon the requirements of each particular application.

As best seen in FIG. 1, in the illustrated embodiment, each of the fin mount surfaces 26 has an angle of inclination a with respect to a line perpendicular to the heat rejecting surface 14 and the heat receiving surface 22. Preferably, this angle of inclination is no greater than 25°. In the embodiment illustrated in FIGS. 1–4, the angle of inclination is 5°. This angle of inclination allows the width W of the tower 24 to taper as the tower 24 extends away from the base 20 so as to somewhat correspond to the reduction in heat conduction required as heat is transmitted up the tower 24. While this construction is preferable because it reduces the weight associated with the tower 24, it should be understood that in some applications it may be desirable for the angle of inclination to be 0° so that the surfaces 26 are perpendicular to the surfaces 14 and 20, as shown in FIG. 5.

It should be appreciated that by providing the tower 24, the heat sink 10 can transfer the heat from the heat rejecting surface 14 primarily in a direction perpendicular thereto, rather than spreading the heat primarily parallel to the surface 14. This allows for the base 20 to be eliminated from areas that do not overlie the surface 14, thereby allowing for airflow past the heat sink 10 over these areas. Further, the tower 24 and its surfaces 26 allow for the use of at least two serpentine fins 30 to reject heat to the airflow from the fan 16.

We claim:

1. A heat sink for use with a fan for cooling an electronic component wherein the heat sink transfers heat from a heat rejecting surface of the electronic component to a cooling airflow provided by the fan, the heat sink comprising;
   a heat conducting base member including a substantially planar heat receiving surface for overlaying the heat rejecting surface of the electronic component to receive heat therefrom;
   a heat conducting tower extending from a side of said base member opposite from said heat receiving surface to receive heat therefrom, the tower including a pair of spaced, oppositely facing fin mount surfaces, the spacing between the fin mount surfaces defining a width of the tower, the fin mount surfaces being planar with the plane of each surface lying within 25° of perpendicular to the heat receiving surface, each of the fin mount surfaces having an area larger than the area of the heat receiving surface; and
   a pair of serpentine fins to transfer heat from the tower to the airflow, each serpentine fin formed from a folded strip of heat conducting material including a plurality of peaks and valleys connected by sidewalls, the valleys of one of the serpentine fins bonded to one of the fin mount surfaces, the valleys of the other serpentine fin bonded to the other fin mount surface.

2. The heat sink of claim 1 wherein the peaks and valleys lie in planes that are substantially perpendicular to the heat receiving surface.

3. The heat sink of claim 1 wherein the peaks and valleys extend substantially parallel to the heat receiving surface.

4. The heat sink of claim 1 wherein the base and the tower are a unitary piece of copper material.

5. The heat sink of claim 1 wherein the tower comprises at least one heat pipe.

6. The heat sink of claim 5 wherein the at least one heat pipe comprises sidewalls that form at least part of each of the fin mount surfaces.

7. The heat sink of claim 5 wherein the heat pipe is embedded in at least one of the tower and the base.

8. The heat sink of claim 1 further comprising a heat pipe in the form a vapor chamber enclosed within the base and the tower and containing a suitable two-phase fluid, with the base acting as an evaporator of the heat pipe and the tower acting as a condenser of the heat pipe.

9. The heat sink of claim 1 wherein the sidewalls comprise louvers.

10. The heat sink of claim 1 wherein the sidewalls comprise slits.

11. The heat sink of claim 1 wherein each of the fin mount surfaces extends past the heat receiving surface in a direction parallel to the heat receiving surface and the fin mount surface.

12. The heat sink of claim 1 wherein the heat receiving surface is larger than the width of the tower in a direction parallel to the width of the tower.

13. The heat sink of claim 1 further comprising additional serpentine fins.

14. A heat sink for use with an impingement type fan for cooling an electronic component wherein the heat sink transfers heat from a heat rejecting surface of the electronic component to an impingement airflow provided by the fan in a direction perpendicular to the heat rejecting surface, the heat sink comprising;
   a heat conducting base member including a substantially planar heat receiving surface for overlaying the heat rejecting surface of the electronic component to receive heat therefrom;
   a heat conducting tower extending from a side of said base member opposite from said heat receiving surface to receive heat therefrom, the tower including a pair of spaced, oppositely facing fin mount surfaces, the spacing between the fin mount surfaces defining a width of the tower, the fin mount surfaces being planar with the plane of each surface lying within 25° of perpendicular to the heat receiving surface; and
   a pair of serpentine fins to transfer heat from the tower to the airflow, each serpentine fin formed from a folded strip of heat conducting material including a plurality of peaks and valleys connected by sidewalls, the peaks and valleys lying in planes that are substantially perpendicular to the heat rejecting surface, the valleys of one of the serpentine fins bonded to one of the fin mount surfaces, the valleys of the other serpentine fin bonded to the other fin mount surface.

15. The heat sink of claim 14 wherein the base and the tower are a unitary piece of copper material.

16. The heat sink of claim 14 wherein the tower comprises at least one heat pipe.

17. The heat sink of claim 16 wherein the at least one heat pipe comprises sidewalls that forms at least part of each of the fin mount surfaces.

18. The heat sink of claim 16 wherein the heat pipe is embedded in at least one of the tower and base.

19. The heat sink of claim 14 further comprising a heat pipe in the form a vapor chamber enclosed within the base and the tower and containing a suitable two-phase fluid, with the base acting as an evaporator of the heat pipe and the tower acting as a condenser of the heat pipe.

20. The heat sink of claim 14 wherein the sidewalls comprise louvers.

21. The heat sink of claim 14 wherein the sidewalls comprise slits.

22. The heat sink of claim 14 wherein each of the fin mount surfaces extends past the heat receiving surface in a direction parallel to the heat receiving surface and the fin mount surface.

23. The heat sink of claim 14 wherein the heat receiving surface is larger than the width of the tower in a direction parallel to the width of the tower.

24. The heat sink of claim 14 further comprising additional serpentine fins.

* * * * *